(12) United States Patent
Middelhoek et al.

(10) Patent No.: US 7,345,476 B2
(45) Date of Patent: Mar. 18, 2008

(54) METHOD AND APPARATUS FOR MEASURING AN ENTITY OF A MAGNETIC FIELD BY USING A HALL PLATE, AN EXCITATION SIGNAL AND A DETECTION SIGNAL

(75) Inventors: Martin Guido Middelhoek, Rijswijk (NL); George Pieter Reitsma, Noordwijk (NL)

(73) Assignee: Systematic Design Holding B.V., Delft (NL)

( * ) Notice: Subject to any disclaimer, the term of this patent is extended or adjusted under 35 U.S.C. 154(b) by 0 days.

(21) Appl. No.: 10/568,113

(22) PCT Filed: Aug. 13, 2004

(86) PCT No.: PCT/NL2004/000573

§ 371 (c)(1),
(2), (4) Date: Feb. 13, 2006

(87) PCT Pub. No.: WO2005/017546

PCT Pub. Date: Feb. 24, 2005

(65) Prior Publication Data

US 2007/0029999 A1    Feb. 8, 2007

(30) Foreign Application Priority Data

Aug. 15, 2003 (NL) .................................. 1024114

(51) Int. Cl.
*G01R 33/06* (2006.01)
(52) U.S. Cl. ........................ 324/251; 324/225
(58) Field of Classification Search ............ 324/207.2, 324/251, 225; 338/32 H
See application file for complete search history.

(56) References Cited

U.S. PATENT DOCUMENTS 4,435,653 A    3/1984    Matui et al.

| | | |
|---|---|---|
| 5,241,270 A | 8/1993 | Ng |
| 5,406,202 A | 4/1995 | Mehrgardt et al. |
| 5,621,319 A | 4/1997 | Bilotti et al. |
| 5,747,995 A | 5/1998 | Spies |
| 5,844,427 A | 12/1998 | Theus et al. |
| 6,154,027 A | 11/2000 | Alexander et al. |
| 6,492,697 B1 | 12/2002 | Plagens et al. |
| 6,768,301 B1 | 7/2004 | Hohe et al. |

FOREIGN PATENT DOCUMENTS

| | | |
|---|---|---|
| EP | 0 704 710 A1 | 4/1996 |
| EP | 1 130 360 | 9/2001 |
| EP | 1 010 987 | 6/2002 |
| EP | 1 206 707 B1 | 2/2003 |

OTHER PUBLICATIONS

Written Opinion and the International Preliminary Examination Report for PCT/NL/2004/000573 and International Search Report for PCT/NL/2004/000573; Dec. 27, 2004; Sep. 19, 2005.

*Primary Examiner*—Jay M Patidar
(74) *Attorney, Agent, or Firm*—Hoffmann & Baron, LLP

(57) ABSTRACT

Method and apparatus for measuring an entity of a magnetic field using a Hall sensor which is provided with at least one Hall plate which has a group of two pairs of terminals located at a distance from one another, an excitation signal supplied from a source to one pair of terminals and a detection signal, which forms a representation of the entity, which is tapped off from the other pair of terminals by a processing circuit. The source is a voltage source of which an impedance is negligible for use of the sensor, and the processing circuit has a negligible input impedance for tapping off me detection signal as a short-circuit current.

16 Claims, 2 Drawing Sheets

METHOD AND APPARATUS FOR MEASURING AN ENTITY OF A MAGNETIC FIELD BY USING A HALL PLATE, AN EXCITATION SIGNAL AND A DETECTION SIGNAL

CROSS-REFERENCE TO RELATED APPLICATIONS

This application is the National Stage of International Application No. PCT/NL2004/000573, filed Aug. 13, 2004, which claims the benefit of Netherlands Application No. NL 1024114, filed Aug. 15, 2003, the contents of which is incorporated by reference herein.

FIELD OF THE INVENTION

The invention relates to a method and apparatus for measuring a magnetic field by using a Hall sensor.

BACKGROUND OF THE INVENTION

Sensors which make use of the well-known Hall effect have long been in widespread use, in particular for carrying out measurements on magnetic fields. In addition to the basic application of measuring the magnetic field strength, these sensors—referred to below as "Hall sensors"—are also used, for example, to measure the position, direction and rotational speed. A conceivable example of the latter application is the measurement of the rotational speed of gearwheels and driveshafts in machines. In addition, the Hall sensor serves, for example, to measure the change in the magnetic field strength when machine components consisting of a magnetic material, such as for example the teeth of a steel gearwheel, pass through the magnetic field of a permanent magnet. In this respect, it is also well known for the Hall sensors to be used in anti-lock brake systems (ABS) for vehicles. For many applications, it is essential for the permanent magnets/magnetic parts used to be as small and lightweight as possible. However, one significant drawback in this respect is the fact that Hall sensors according to the current state of the art are relatively unsuitable for the accurate measurement of weak magnetic fields (with a magnetic field strength of less than one milli-Tesla). This drawback generally has the effect of increasing costs. For example, for Hall sensors to be used effectively in the abovementioned ABS systems, it is necessary to use expensive rare earth magnets in order to create a sufficiently high magnetic field strength to allow sufficiently accurate measurements to be carried out with the aid of the sensor. Also, applications of this nature impose high demands on the linearity and accuracy of the required electronic amplification and signal-processing features and on the sensor housing, which likewise has the effect of increasing costs.

For many applications, it is desirable for Hall plates, generally together with amplification and signal-processing electronics, to be integrated in semiconductor material, for example in silicon using the well-known CMOS process. In addition to the advantage of simple integration of electronic components in silicon, this also has the disadvantage that the measurement accuracy and sensitivity of Hall plates according to the current state of the art are in fact adversely affected by factors which are inherent to their integration in silicon semiconductor material.

The traditional principle of carrying out measurements on magnetic fields using Hall plates, when using Hall plates integrated in silicon semiconductor material, also has an adverse effect on the measurement accuracy and sensitivity of the sensor. This is because in this traditional measurement principle, a current is used as excitation signal, and the resulting Hall voltage is measured, forming a representation of the field strength of the magnetic field in which the sensor is situated. One significant drawback of this is that mathematical analysis is able to demonstrate that an integrated Hall sensor has non-linearities which are dependent on an electric voltage and are very difficult to compensate for when using the abovementioned principle of current excitation and voltage detection.

The most important factors inherent in their integration in silicon semiconductor material which have an adverse effect on the measurement accuracy and sensitivity of Hall plates integrated in silicon semiconductor material in accordance with the current state of the art are:

- offset voltages caused by mechanical stresses in the crystal lattices of the semiconductor materials used via the piezo-resistance effect;
- offset voltages caused by the Seebeck effect: temperature differences create a position-dependent contact potential at the transition between semiconductor material and metal terminals at different locations on the Hall plate;
- offset voltages caused by local geometric inaccuracies in the semiconductor material, formed during the integration process (for example alignment errors for the terminals, etching variations);
- offset voltages resulting from accumulated charge at the transition between silicon and silicon oxide;
- offset and non-linearities of electronic features for, for example, amplifying and processing output signals from Hall plates, the said circuits likewise being adversely affected by the abovementioned factors if they are integrated in semiconductor material, whether or not on the same substrate as the associated Hall plates themselves.

Offset voltages in Hall sensors may be greater by a factor of 1000 than the Hall voltages which are ultimately to be measured. In the past, therefore, various methods have been developed attempting to compensate for the various offset voltages and other disadvantageous factors in order to increase the measurement accuracy and sensitivity of Hall sensors.

In a first approximation, a Hall plate can be modelled as a balanced resistance bridge (Wheatstone bridge). The abovementioned stresses in the crystal lattice of the semiconductor materials used changes the level of certain resistances in the bridge, resulting in the formation of an offset voltage which may be of the order of magnitude of a few tens of milli-Tesla. In addition, the abovementioned Seebeck effect is responsible for a static (current- and voltage-independent) offset voltage of the order of magnitude of a few milli-Tesla. This offset voltage is added to the output (Hall) voltage of the Hall plate. The Hall plate then delivers an output voltage where no magnetic field is present. The magnetic field strength which would have to be measured with an "ideal" Hall plate in order to generate a Hall voltage of the same order of magnitude as this offset voltage may easily amount to several tens of milli-Tesla.

By mathematical analysis, it is possible to demonstrate that the abovementioned static offset resulting from the Seebeck effect can be compensated by carrying out measurements in pairs, with the direction of the excitation current being reversed for the second sub-measurement in each case and the difference in the Hall voltage resulting from the two sub-measurements then being determined.

Mathematical analysis can also be used to demonstrate that the abovementioned offset resulting from stresses can be compensated for by carrying out measurements using two Hall plates, with the second Hall plate rotated through 90° with respect to the first. The difference in the output (Hall) voltages from the two Hall plates is in each case determined. U.S. Pat. No. 5,241,270 uses this method in modified form, with two Hall plates employed simultaneously, so that the two measurements mentioned above can be carried out simultaneously, rather than in succession.

Numerous known methods which attempt to compensate for the offset resulting from stresses are based on a configuration also known as an "orthogonally switched Hall plate", since the current directions of the excitation currents are perpendicular to one another in the two sub-measurements. Most Hall sensors according to the current state of the art comprise a square Hall plate with electrical terminals at the corners. In the case of the abovementioned offset compensation method using orthogonally switched Hall plates, the measurements are in most cases carried out in pairs, in which case in the first sub-measurement an excitation current is passed through the Hall plate between two opposite terminals, and the resulting Hall voltage is measured across the two other, opposite terminals. Instead of reversing the direction of the excitation current as described above, for the second sub-measurement the pairs of terminals for the excitation current and the Hall voltage are swapped over, so that the direction of the excitation current is now rotated through 90° with respect to the direction in the first sub-measurement. The polarity of the Hall voltage which is measured during the second sub-measurement is then inverted, and this voltage is added to the measured Hall voltage from the first sub-measurement. Inter alia, patent documents U.S. Pat. No. 5,406,202, U.S. Pat. No. 5,844,427, EP 1 010 987 A2 and EP 1 130 360 A2 describe Hall sensors in which offset compensation methods of this type with orthogonally switched Hall plates are used. This method can only provide complete offset compensation if the Hall plates used were to have a completely linear behaviour in functional respects. On account of their design, however, Hall plates formed in semiconductor material are inherently nonlinear. It can be demonstrated that the most important nonlinearities in Hall plates are dependent on an electric voltage. However, since the offset compensation methods described above use current excitation and voltage detection, it is impossible to completely compensate for nonlinear offset terms. Moreover, according to the method described of orthogonal switching of Hall plates, the direction of the excitation current cannot be completely (180°) reversed, but rather can only be turned through 90°, and consequently the offset resulting from the Seebeck effect is not compensated for, with the result that a significant offset term remains present. The literature has disclosed offset compensation methods which make use of the abovementioned orthogonal switching, but through 360° rather than through 90°. Hall sensors in which this method is used are known in the literature as spinning current Hall sensors. The Hall plates used in this case are generally provided with eight terminals and have a symmetry which is such that in each case a straight connecting line between two opposite terminals is orthogonal (perpendicular) with respect to a straight connecting line between two other terminals. In this case, during eight sub-measurements, in each case a fixed excitation current passes between two opposite terminals, and the associated Hall voltage is measured between the two terminals whose straight connecting line is orthogonal with respect to the straight connecting line between the two terminals mentioned first. The resulting Hall sensor is produced by the German Fraunhofer IIS. The relatively large number of terminals of the Hall plate in this sensor, however, is responsible for an undesirable reduction in the sensitivity of the sensor with respect to Hall plates having a smaller number of terminals. In this case too, current excitation and voltage detection are used, and consequently nonlinear offset terms are not fully compensated for.

U.S. Pat. No. 5,621,319 describes a method for compensating for the offset resulting from mechanical crystal stresses in integrated Hall sensors. Use is made of the above-described spinning method with orthogonal switching of the Hall plate. In addition, use is made of voltage excitation rather than current excitation. However, the drawback is that this voltage excitation is combined with voltage detection, and consequently the offset resulting from stresses is not in fact compensated for, on account of the directional-dependent nature of electrical properties of the semiconductor material (anisotropy).

In many patent documents, such as the abovementioned U.S. Pat. No. 5,406,202 and U.S. Pat. No. 5,844,427, which describe methods for compensating for the offset resulting from crystal stresses in integrated Hall sensors, it is attempted to achieve initial offset compensation by parallel-connection of a plurality of Hall plates which are rotated through a defined angle with respect to one another. In most cases, this involves two Hall plates which are rotated through an angle of 90° with respect to one another. It can be demonstrated by mathematical means that this approach can only function optimally if four Hall plates are connected in parallel, of which the second, third and fourth plates are respectively rotated through 90, 180 and 270° with respect to the first plate, and if voltage excitation and current detection are also used. Document EP 1 206 707 B1 does indeed use a configuration with four Hall plates, but these plates are only rotated through in each case 45° rather than 90°. In functional terms, the four Hall plates in this case in reality form a single spinning current Hall plate with eight terminals, as described above, with the associated drawbacks as likewise described above.

A further significant source of offset in Hall sensors is the offset and nonlinearity of electronic features for, for example, amplifying and processing output signals from Hall plates. The fact that these electronic features are often integrated with the Hall plates in the same semiconductor substrate offers possibilities for, for example, combining compensation for the offset of an integrated amplifier with compensation for the offset of a Hall plate resulting from the Seebeck effect. U.S. Pat. No. 6,154,027 describes a method in which the output signal of a spinning current Hall plate is firstly pre-amplified before being demodulated. However, this involves spinning through 90° in two stages rather than spinning through 360° in four stages. Consequently, the offset resulting from the SEEBECK effect is not compensated for.

The offset resulting from mechanical crystal stresses in the semiconductor material of a Hall sensor varies for different crystal directions. Nevertheless, the relevant literature in this field provides scarcely any information about the optimum orientation of a Hall plate in semiconductor material. Research carried out by the Applicant has demonstrated that the sensitivity of a Hall plate to stress can be reduced by a factor of 10 by selecting the appropriate orientation.

To summarize, on the basis of what has been stated above, it can be concluded that hitherto it has not been possible to solve the problems inherent to the current state of the art in this field in order to sufficiently compensate for the effect of factors which have a negative influence on the measurement accuracy and sensitivity of integrated Hall sensors.

It is an object of the present invention to eliminate the abovementioned drawbacks.

SUMMARY OF THE INVENTION

According to the invention, this object is achieved by the provision of a method as described below.

One significant advantage obtained as a result is that for each Hall plate used, there are no nonlinearities dependent on an electric voltage. Even for the above-described method for initial compensation for the offset resulting from crystal stresses in integrated Hall sensors by parallel connection of a plurality of Hall plates rotated with respect to one another to function optimally, it is more advantageous to use the voltage excitation/current detection combination.

Furthermore, according to the method of the invention, to perform measurements on magnetic fields using a Hall sensor, it is advantageously possible to use Hall plates whose largest plane has two pairs of terminals (A1, A2) and (B1, B2), with the terminals of each pair of terminals being placed at opposite positions in the said plane of the plate, and with the abovementioned plane of the plate being shaped in such a manner that the abovementioned plane of the plate is mirror-symmetrical with respect to the straight connecting line between the two terminals of a pair of terminals. Measurements using Hall plates according to the invention of this type are then characterized by the fact that an excitation voltage $V_{ex}(X+, Y-)$ is applied to a pair of terminals (X, Y), with $(X, Y) \in \{(A1, A2), (B1, B2)\}$, and the detection current $I_{det}(X \rightarrow Y)$ which flows through the Hall plate between the terminals of the other pair of terminals being measured with short-circuited terminals of the latter pair of terminals, the measurement being carried out in four stages $\{V_{ex}(A1, A2), I_{det}(B1 \rightarrow B2)\}$
$\{V_{ex}(B1, B2), I_{det}(A2 \rightarrow A1)\}$
$\{V_{ex}(A2, A1), I_{det}(B2 \rightarrow B1)\}$
$\{V_{ex}(B2, B1), I_{det}(A1 \rightarrow A2)\}$ which can be run through in any desired order, during which period the type and signal form of the excitation voltage remain constant, after which a representation of the measured variable is determined via electronic processing from the four measured values for the detection signal $I_{det}(X \rightarrow Y)$. However, the nature and/or signal form of the excitation voltage can be altered between the abovementioned measurements comprising four stages. In many cases, the abovementioned "measured variable" will be the magnetic field strength.

This is therefore a spinning voltage method, with the spinning taking place through 360°, in stages of 90°. As described above, it is in this way possible to effect optimum compensation for the offset resulting from the Seebeck effect. It is also possible to use Hall plates with just four terminals, which is of benefit to the sensitivity of the Hall sensor.

Furthermore, according to the method of the invention, to carry out measurements on magnetic fields using a Hall sensor, it is advantageous for the abovementioned determination of a representation of the measured variable via electronic processing of the abovementioned four measured values for the detection signal $I_{det}(X \rightarrow Y)$ only to be allowed to take place after this detection signal has been amplified.

In this way, when using the above-described spinning voltage method through 360°, in steps of 90°, it is possible to compensate for both the offset resulting from the Seebeck effect and the offset of the amplifier in a single step. The said electronic processing of the measured values for the detection signal could, for example, be quadrature demodulation. The method according to the invention for carrying out measurements on magnetic fields using a Hall sensor may furthermore advantageously be characterized by the fact that the said electronic processing of the said four measured values for the detection signal $I_{det}(X \rightarrow Y)$ comprises, inter alia, averaging of these measured values.

According to the method of the invention for carrying out measurements on magnetic fields using a Hall sensor, it is preferable to use Hall plates which are formed in n-type silicon semiconductor material.

Hall plates which are formed in p-type silicon have a weaker Hall effect than n-type plates, with the result that factors causing offset, such as for example crystal stresses, have in relative terms a greater detrimental influence. p-Type Hall plates are therefore less suitable for achieving optimum offset compensation.

According to the method of the invention for carrying out measurements on magnetic fields using a Hall sensor, it is furthermore advantageous, if the said semiconductor Hall plates are produced in n-type silicon semiconductor material via a process which has resulted in the substrate surface coinciding with the (100) crystal plane of the silicon semiconductor material, to use Hall plates whose orientation in the crystal plane is such that the straight connecting line between the terminals A1 and A2 of the pair of terminals (A1, A2) and the straight connecting line between the terminals B1 and B2 of the pair of terminals (B1, B2) coincides with or is orthogonal with respect to the [010] or [001] crystal axes or equivalent crystal directions of the silicon semiconductor material.

When using a Hall plate as described above, with four terminals, and voltage spinning through 360°, in stages of 90°, it is therefore possible, according to research carried out by the Applicant, to reduce the offset resulting from mechanical crystal stresses by a factor of ten. In the case of the abovementioned, known Hall plate with eight terminals and using current spinning, it is never possible to achieve the ideal orientation of the plate, since in that case there will always be pairs of terminals whose straight connecting line neither coincides with nor is orthogonal with respect to the [010] or [001] crystal axes or equivalent crystal directions of the silicon semiconductor material.

According to the method of the invention for carrying out measurements on magnetic fields using a Hall sensor, it is advantageously possible to use four of the said Hall plates, each with two pairs of terminals (A1, A2) and (B1, B2), with the second, third and fourth plates respectively rotated through 90°, 180° and 270° with respect to the first plate, and the four plates being parallel-connected as a result of in each case the corresponding terminals of the four plates being connected to one another.

Therefore, in combination with voltage excitation and current detection, it is possible to achieve a reduction in the offset resulting from mechanical crystal stresses and the offset resulting from the Seebeck effect.

According to the method of the invention for carrying out measurements on magnetic fields using a Hall sensor, it is furthermore advantageous to use a Hall sensor having the said four parallel-connected Hall plates which comprises a silicon chip in which the four Hall plates are all integrated in the same silicon substrate.

This allows optimum compensation for the offset resulting from crystal stresses and the offset resulting from the Seebeck effect. If, moreover, the optimum orientation of the first Hall plate with respect to the crystal axes has been determined, this is automatically also optimal for the other three plates, despite their rotated positions.

According to the method of the invention for carrying out measurements on magnetic fields using a Hall sensor, it is preferable to use Hall plates which comprise a layer of n-type silicon located between an underlying substrate of p-type silicon and a top layer of p-type silicon.

This structure, which is known as a pinched structure, generates less flicker noise. Also, pinching results in the formation of broader depletion regions in the layer of n-type silicon, and consequently the Hall plate effectively becomes thinner, which increases the sensitivity of the plate. One drawback is that a Hall plate with pinching is less linear than a plate which is not pinched. The use of voltage excitation and current detection makes it possible to compensate for the nonlinearity which is dependent on an electric voltage.

According to the method of the invention for carrying out measurements on magnetic fields using a Hall sensor, it is advantageously possible for the output signal from the abovementioned Hall plate(s) to be passed through a delay line with a structure which is such that, after they have been summed and averaged, the measured values are delivered with the same frequency as the frequency with which the said four measurement stages $\{V_{ex}(X+, Y-), I_{det}(X \rightarrow Y)\}$ are passed through.

One drawback of spinning methods in general is the fact that a plurality of sub-measurements have to be carried out for each representation of the measured variable. This drawback is compensated for by the use of a delay line as described above. This method is also known as staggered processing. A combination of this with, for example, quadrature demodulation allows both the offset and the Hall signal to be estimated. The estimates for the offset can then be used to optimize the dynamic range of the Hall sensor.

The abovementioned object is also achieved, according to the invention, by the provision of an apparatus as described below.

In addition to the evident advantages of the integration of a plurality of electronic features, another important advantage is the fact that the variation in, for example, material parameters and temperature between separate integrated circuits, known as inter-chip variation, is generally greater than the variation between circuits which are integrated in the same silicon substrate, known as intra-chip variation. Therefore, the latter variant offers better options for offset compensation.

The invention will be explained in more detail in the following text on the basis of exemplary embodiments of apparatuses according to the invention, in which the method according to the invention is implemented, which are diagrammatically depicted in the drawings. In this context, it should be noted that the variant embodiments illustrated are selected purely by way of illustration but do not in any way restrict the scope of application of the invention.

DETAILED DESCRIPTION OF PREFERRED EMBODIMENTS

In the following description of a Hall sensor with reference to FIG. 1, it is assumed that the Hall plates, electronic features and wiring illustrated are all integrated in the same silicon substrate and form part of the same silicon chip. Furthermore, it is assumed that use is made of n-type Hall plates, that the integrated circuit has a pinched structure and that the substrate surface coincides with the (100) crystal plane of the silicon semiconductor material used.

The variant embodiment of a Hall sensor according to the invention comprises a combined Hall plate composed of four sub-plates 101 to 104. Each sub-plate has a group of two pairs ((A1, A2), (B1, B2)) of terminals (A1, A2, B1, B2). The terminals of each pair are arranged at opposite corners of the sub-plate, in such a manner that connecting lines between the terminals of the respective pairs are perpendicular to one another. The groups of pairs of terminals of adjacent plates are rotated through 90° with respect to the perpendicular to the plates.

Figure 1:
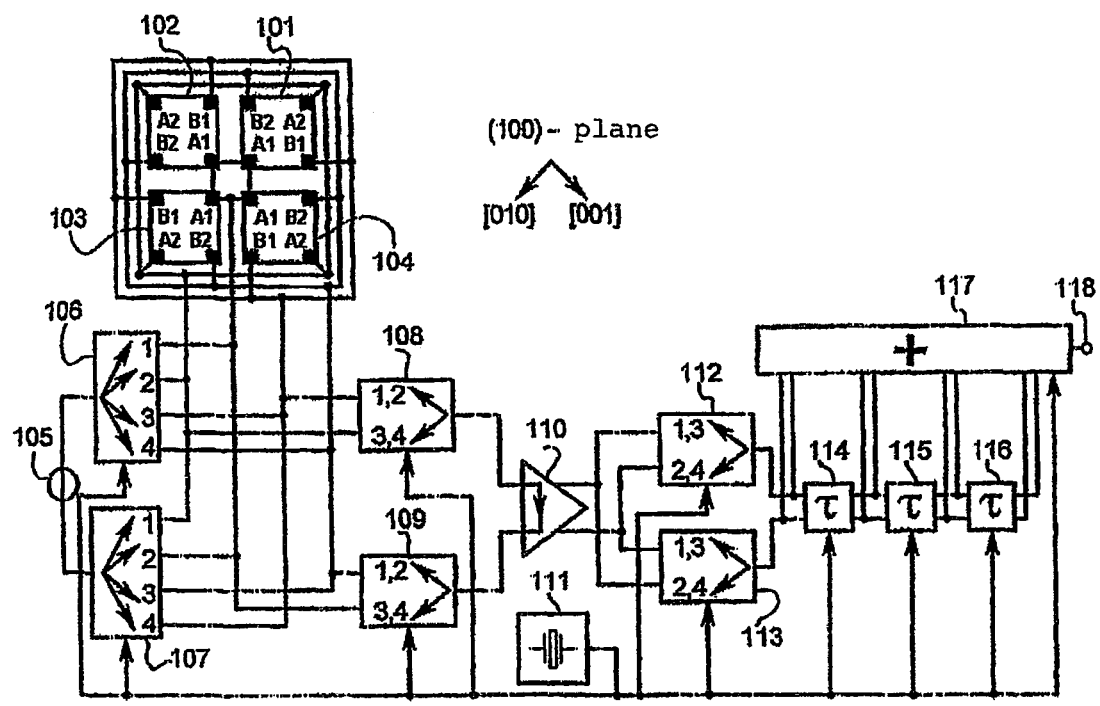
FIG. 1 diagrammatically depicts a variant embodiment of a Hall sensor according to the invention in which the method according to the invention is implemented.

As shown in FIG. 1, the sub-plates 101 to 104 are arranged in a square formation. The direction in which groups of pairs of terminals of adjacent plates have been rotated through an angle of 90°, referred to here as the group orientation, is identical to the direction of the order in which the sub-plates in question are viewed, referred to below as the sub-plate orientation.

Corresponding terminals of the four sub-plates are electrically connected to one another, so that the four sub-plates are in fact connected in parallel. As can be seen from FIG. 1, for all the sub-plates it is the case that the straight connecting line between the terminals belonging to a pair of terminals is parallel to or orthogonal with respect to the [010] or [001] crystal axes, which are also indicated in the figure.

The four parallel-connected terminals of the combined Hall plate are now connected to the four outputs of switching means 106 and 107 and to the two inputs of switching means 108 and 109, as shown in FIG. 1. The said switching means 106, 107, 108 and 109, which in technical terms can be realized in numerous known ways and using conventional components, receive a clock signal from oscillator 111 and have four switching states (1 to 4); in each switching state, an input of the switching means is connected to an output of the same switching means. In the figure, the arrows in the switching means denote which input is connected to which output for each switching state. For example, in switching state 1, the input of switching means 106 is connected to the terminals A1 of the combined Hall plate, and in switching states 1 and 2, the terminals B1 of the combined Hall plate are connected by switching means 108 to the output of the latter switching means. Switching states 1 to 4 are passed through cyclically, as triggered by a clock signal generated by oscillator 111.

The inputs of switching means 106 and 107 are connected to voltage source 105, which has an impedance that is negligible for use of the sensor, preferably zero, and delivers a voltage which is suitable for use as excitation voltage for the Hall plates. The switching means 106 and 107 and the parallel connection of the sub-plates 101, 102, 103 and 104 of the combined Hall plates now ensure that, for each cycle of four switching states, the said excitation voltage from voltage source 105 is applied twice to each of the two pairs of terminals of the sub-plates, once with an inverted sign. Each time per switching state that the excitation voltage is applied to four parallel-connected pairs of terminals of the four sub-plates, the switching means 108 and 109 ensure that the total of the (Hall) currents which pass through the other four parallel-connected pairs of terminals of each sub-plate are read (detected) and fed to two differential inputs of an amplification means 110. The latter may, for example, be a current amplifier. The impedance of the amplifier means 110 between the differential inputs is negligible and preferably zero. Each of the differential inputs of the amplifier means 110 has a high, preferably infinite impedance to earth (ground). This way, the currents which then pass through the Hall plates and the differential inputs of the amplifier means 110 are approximately short-circuit currents and form a representation of the magnetic field strength measured by the Hall sensor. Following the amplification means 110, the sign of two of the four measured values which are supplied during a cycle of four switching states is inverted by the two switching means 112 and 113. These switching means, which in technical terms can be realized in a wide range of known ways and using conventional components, receive a clock signal from oscillator 111 and, like the switching means 106 to 108, have four switching states (1 to 4), as indicated in the figure.

The variant embodiment of the apparatus according to the invention described here is in fact a spinning voltage Hall sensor with four terminals. The currents which are read can be processed further in both analogue and digital form, depending on the requirements of the specific application. Analogue-digital converters and other auxiliary electronic means are of no relevance to the present description and are therefore not depicted in the figure.

On account of the fact that the "spinning" comprises four stages, coinciding with the four abovementioned switching states, the Hall sensor described here could supply an output value after each cycle of four stages. To obtain a representative measured value more quickly, it is possible to use staggered processing. In this case, the outputs of the switching means 112 and 113 are connected to a delay line comprising three sections 114, 115 and 116. Under the control of the oscillator 111, during each switching state an output signal from the switching devices 112 and 113 is fed to the delay line. The outputs of the said switching devices 112 and 113 and the outputs of each of the three sections 114, 115 and 116 of the delay line are connected to an adding means 117, which under the control of oscillator 111 adds up the output signals of the switching features 112 and 113, and the output signals from the sections 114, 115 and 116 of the delay line, during each switching state. The adding means 117 supplies, at an output 118 of the Hall sensor, an output signal which represents an average measured value of which the average moves with the frequency of the oscillator 111.

FIGS. 2 to 5 show, without reference numerals and letters for the sake of clarity, the four Hall plates 101 to 104 from FIG. 1 for the respective four switching states described. In FIGS. 2-5, arrows show the currents which pass through the plates 101-104 and, at the same time, through the voltage source 105 during the four abovementioned switching states of the switching means 106 and 107.

Figure 3:
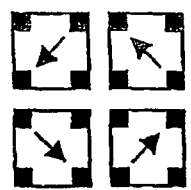
Figure 5:
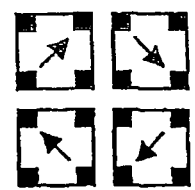

It can be seen from FIGS. 3 and 5 that the currents shown together correspond to a current through a loop comprising a coil with a single turn. Since the plates 101-104 are of limited size, the integral of the magnetic flux in the plane of the loop will not be equal to zero irrespective of the direction of the current. As a result, in the situations shown in FIGS. 3 and 5, this current generates a residual magnetic field which has an adverse effect on the measurement of an external magnetic field.

Figure 6:
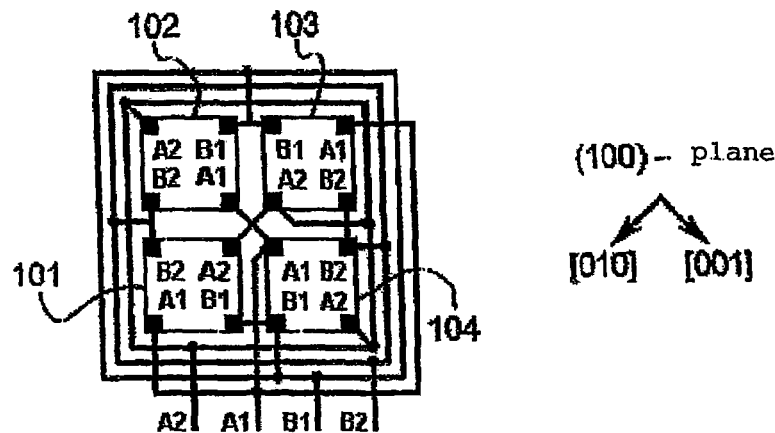
FIG. 6 diagrammatically depicts another variant embodiment of the wiring around and between the Hall plates shown in FIG. 1 and their terminals with the wiring.

FIG. 6 shows the Hall plates 101-104, with the terminals A1, A2, B1, B2 arranged in such a manner, and with associated wiring which is such, that the group orientation of the terminals A1, A2, B1, B2 is opposite to the sub-plate orientation. As a result, the terminals of the sub-plates in the center of the combined plate are alternately connected to two different terminals of the switching means 106 and 107 for the same pair of terminals (A1, A2 in FIG. 6).

FIGS. 7 to 10, like FIGS. 2 to 5, use arrows to show the direction of the currents which pass through the plates 101-104 and, at the same time, through the voltage source 105 in the four switching states of the switching means 106 and 107.

Figure 2:
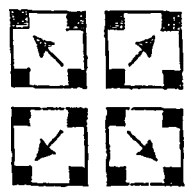
FIGS. 2 to 5 diagrammatically depict currents which occur in Hall plates of the sensor shown in FIG. 1 in various phases of operation of the latter.
Figure 4:
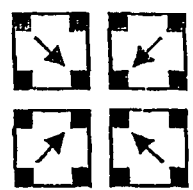
Figure 7:
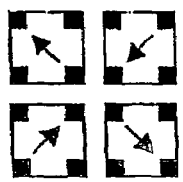
FIGS. 7 to 10 diagrammatically depict currents which occur in the Hall plates when using the wiring and terminals thereof as shown in FIG. 6.
Figure 9:
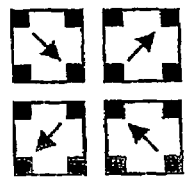

The situations shown in FIGS. 7 and 9 correspond to the situations shown in FIGS. 2 and 4.

Figure 8:
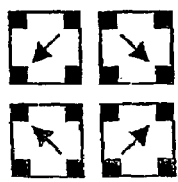
Figure 10:
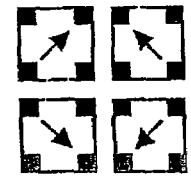

The situations shown in FIGS. 8 and 10 appear to correspond to the situations shown in FIGS. 3 and 5. However, in the situations shown in FIGS. 8 and 10, the integral of the magnetic flux generated by the currents over the finite surface area of the Hall plates is minimal (zero under ideal conditions and without external magnetic field). As a result, these currents will generate (virtually) no residual magnetic field in the sub-plates, and consequently they have no adverse effect on the measurement of an external magnetic field. For this reason, the arrangement of the sub-plates shown in FIG. 6 is preferred.

Figure 11:
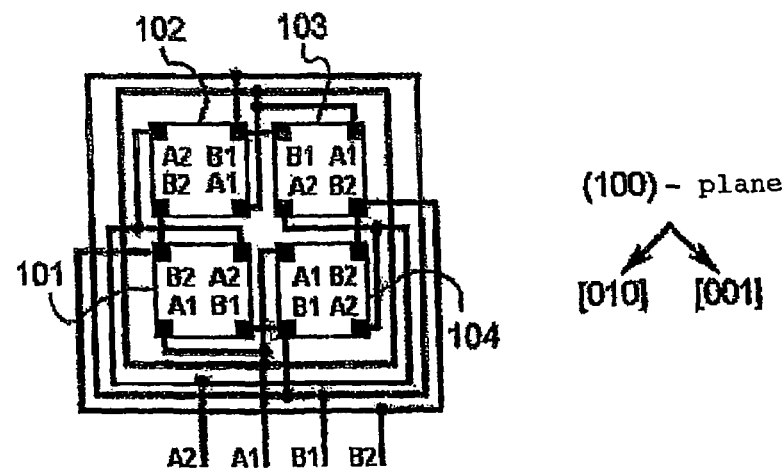
FIG. 11 diagrammatically depicts a preferred variant of the wiring around and between the Hall plates shown in FIG. 1 and their terminals with the wiring.

The currents in the various sections of the wiring between and around the sub-plates 101-104 also appear to have the ability to cause a residual magnetic field in the sub-plates, which has an adverse effect on the measurement of an external magnetic field, as a function of the arrangement of the wiring. FIG. 11 shows an arrangement of the wiring which generates a minimal residual magnetic field. Therefore, the arrangement of the wiring shown in FIG. 11 is preferred. The same also applies to other arrangements of the wiring to obtain a similar result.

It should be noted that it will be clear to a person skilled in the art, on reading the description and the claims, that various alternative embodiments are possible within the scope of the appended claims. For example, it is possible for the plurality of Hall plates to be arranged in different locations and with different orientations with respect to one another from those described here and shown in the figures. Within the scope of the claims, it is possible for a Hall plate to be arranged even with its main plane perpendicular to a main plane of a substrate, and for its terminals to be arranged at a main plane of the substrate along a single edge of the Hall plate, in which case terminals belonging to one pair of terminals alternate with terminals belonging to the other pair of terminals.

What is claimed is:

1. Method for measuring an entity of a magnetic field using a Hall sensor, which is provided with at least one Hall plate which includes a group of two pairs ((A1, A2), (B1, B2)) of terminals (A1, A2, D1, B2) located at a distance from one another, an excitation signal being supplied from a source to one pair of terminals, and a detection signal, which forms a representation of the entity, being tapped off from the other pair of terminals by a processing circuit, wherein the source is a voltage source of which an impedance is negligible for use of the sensor, and the processing circuit has a negligible input impedance for tapping off the detection signal as a short-circuit current.

2. Method according to claim 1, wherein the measurement of the entity is carried out in cycles of in each case four sub-measurements, to provide four measured values for the entity, with the pairs of terminals of the plates being alternately connected to the voltage source and to the processing circuit, the polarity of the voltage source being reversed during two sub-measurements with respect to the other two sub-measurements.

3. Method according to claim 1, wherein the measurement of the entity is carried out in cycles of in each case four sub-measurements, to provide four measured values for the entity, with the pairs of terminals of the plates being alternately connected to the voltage source and to the processing circuit, the polarity of the voltage source being reversed during two sub-measurements with respect to the other two sub-measurements, the processing circuit amplifies the detection signal prior to processing of the detection signal.

4. Method according to claim 1, wherein the measurement of the entity is carried out in cycles of in each case four sub-measurements, to provide four measured values for the entity, with the-pairs of terminals of the plates being alternately connected to the voltage source and to the processing circuit, the polarity of the voltage source being reversed during two sub-measurements with respect to the other two sub-measurements, the processing of the four measured values comprises the reversing of the polarity of the measured values of the two sub-measurements for which the polarity of the voltage source was reversed with respect to the other two sub-measurements, and the measured values of the two other sub-measurements and the two measured values with reversed polarity are summed.

5. Method according to of claim 1, wherein the measurement of the entity is carried out in cycles of in each case four sub-measurements, to provide four measured values for the entity, with the pairs of terminals of the plates being alternately connected to the voltage source and to the processing circuit, the polarity of the voltage source being reversed during two sub-measurements with respect to the other two sub-measurements, Hall plates which are made from n-type silicon semiconductor material are used.

6. Method according to claim 5, wherein if the said semiconductor Hall plates are made from n-type silicon semiconductor material using a process which resulted in the substrate surface coinciding with the crystal plane of the silicon semiconductor material, plates are used whose orientation in the crystal plane is such that a straight connecting line between the terminals of each pair of terminals coincides with or is orthogonal with respect to the [010 ]or [001 ]crystal axes or equivalent crystal directions of the silicon semiconductor material.

7. Method according to of claim 1, wherein the measurement of the entity is carried out in cycles of in each case four sub-measurements, to provide four measured values for the entity, with the pairs of terminals of the plates being alternately connected to the voltage source and to the processing circuit, the polarity of the voltage source being reversed during two sub-measurements with respect to the other two sub-measurements, four Hall plates are integrated in a common silicon substrate in such a maimer that the group of terminals of each Hall plate, with respect to a perpendicular to a main plane of the plates, is rotated through 90, 180 and 270°, respectively, with respect to the other groups of terminals, and the same terminals of the different groups are connected to one another in accordance with the different orientation for adjacent plates.

8. Method according to claim 7, wherein the Hall plates are arranged in a square formation, with an orientation of their groups of terminals which is such that a direction in which one looks from one Hall plate towards an adjacent Hall plate is opposite to a direction in which the group of terminals of the one Hall plate is rotated through 90° with respect to the group of terminals of the other Hall plate.

9. Method according to of claim 7, wherein wiring to, from and between the Hall plates is arranged in such a manner that currents running from and to the voltage source generate magnetic fields which substantially cancel one another out in the main plane of the Hall plates.

10. Method according to claim 1, wherein Hall plates which comprise a layer of n-type silicon located between an underlying substrate of p-type silicon and a top layer of p-type silicon are used.

11. Method according to claim 1, wherein the measurement of the entity is carried out in cycles of in each case four sub-measurements, to provide four measured value for the entity, with the pairs of terminals of the plates being alternately connected to the voltage source and to the processing circuit, the polarity of the voltage source being reversed during two sub-measurements with respect to the other two sub-measurements, the processing circuit stores the measured values for every four successive sub-measurements, and for each sub-measurement the four measured values obtained last are summed to give a processed measured value for the variable.

12. Method according to claim 1, wherein switching means are arranged to alternately connect the pairs of terminals of the source and the processing circuit between the pairs of terminals and the source and the processing circuit.

13. Apparatus for measuring an entity of a magnetic field using a Hall sensor, which is provided with at least one Hall plate which has a group of two pairs ((A1, A2), (B1, B2)) of terminals (A1, A2, B1, B2) located at a distance from one another, one pair of terminals being connected to a source for supplying an excitation signal to the one pair of terminals, and another pair of terminals being connected to a processing circuit for tapping off and processing a detection signal from the other pair of terminals, wherein the source is a voltage source of which an impedance is negligible for use of the sensor, the processing circuit has a negligible input impedance for tapping off the detection signal as a short-circuit current.

14. Apparatus according to claim 13, wherein switching means are arranged to alternately connect the pairs of terminals of the source and the processing circuit between the pairs of terminals and the source and the processing circuit.

15. Apparatus according to claim 13, wherein four Hall plates are provided in a square formation and integrated in a single substrate, the groups of terminals of the Hall plates being oriented in such a manner with respect to a perpendicular to a main plane of the plates that one group of terminals of a Hall plate is rotated through 900 with respect to a group of terminals of an adjacent Hall plate, in a direction which is opposite to the direction in which the other Hall plate follows the one Hall plate, and the same terminals are connected to one another in accordance with the different orientation for adjacent plates.

16. Apparatus according to claim 13, wherein a wiring is connected to the terminals of the Hall plates, the wiring having an arrangement which is such that currents running from and to the voltage source generate magnetic fields which substantially cancel one another out in the main plane of the Hall plates.

* * * * *

UNITED STATES PATENT AND TRADEMARK OFFICE
CERTIFICATE OF CORRECTION

PATENT NO. : 7,345,476 B2 Page 1 of 1
APPLICATION NO. : 10/568113
DATED : March 18, 2008
INVENTOR(S) : Middelhoek et al.

It is certified that error appears in the above-identified patent and that said Letters Patent is hereby corrected as shown below:

At column 10, line 64, claim 1, the printed patent incorrectly reads "...terminals (A1, A2, D1, B2) located...", and should read --...terminals (A1, A2, B1, B2) located...--.

Signed and Sealed this

First Day of July, 2008

JON W. DUDAS
*Director of the United States Patent and Trademark Office*